(12) United States Patent
Chik et al.

(10) Patent No.: US 7,672,748 B2
(45) Date of Patent: Mar. 2, 2010

(54) AUTOMATED MANUFACTURING SYSTEMS AND METHODS

(75) Inventors: Mohd Azizi Chik, Johor Bahru (MY); Tin Tin Ung, Singapore (SG); Thangappan Krisnamuthi, Johor Bahru (MY); Kian Wee Lim, Singapore (SG); Lip Hong Lim, Singapore (SG); Brandon Lee, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 229 days.

(21) Appl. No.: 11/735,998

(22) Filed: Apr. 16, 2007

(65) Prior Publication Data

US 2007/0244594 A1     Oct. 18, 2007

Related U.S. Application Data

(60) Provisional application No. 60/744,998, filed on Apr. 17, 2006.

(51) Int. Cl.
*G06F 19/00* (2006.01)
(52) U.S. Cl. .................................................. 700/112
(58) Field of Classification Search ................... 700/95, 700/99–102, 112–114, 213, 224–226, 228
See application file for complete search history.

(56) References Cited

U.S. PATENT DOCUMENTS

| | | | |
|---|---|---|---|
| 3,952,388 A * | 4/1976 | Hasegawa et al. ........... 29/33 P |
| 6,122,566 A * | 9/2000 | Nguyen et al. .............. 700/218 |
| 6,853,876 B2 * | 2/2005 | Wehrung et al. ............ 700/230 |
| 6,871,113 B1 | 3/2005 | Maxim et al. |
| 6,877,944 B2 * | 4/2005 | Peiter ......................... 414/279 |
| 7,065,856 B1 * | 6/2006 | Lemelson ..................... 29/563 |
| 7,151,980 B2 * | 12/2006 | You et al. .................... 700/214 |
| 2004/0039469 A1 | 2/2004 | Lin |
| 2004/0073331 A1 | 4/2004 | Chang et al. |
| 2004/0111339 A1 * | 6/2004 | Wehrung et al. .............. 705/30 |
| 2005/0096784 A1 * | 5/2005 | Lai ............................. 700/228 |
| 2005/0216115 A1 | 9/2005 | You et al. |
| 2005/0273190 A1 | 12/2005 | Duffin et al. |
| 2006/0045662 A1 * | 3/2006 | Aalund et al. ............... 414/217 |

(Continued)

FOREIGN PATENT DOCUMENTS

EP          1569262          8/2005

OTHER PUBLICATIONS

Chik et al., Cycle Time Reduction Through Event Based Management Approach in 300mm Wafer Foundry, 3rd ISMI Symposium on Manufacturing Effectiveness, Oct. 9-11, 2006, Austin, Texas.

(Continued)

*Primary Examiner*—M. N. Von Buhr
(74) *Attorney, Agent, or Firm*—Horizon IP Pte Ltd

(57) ABSTRACT

An efficient manufacturing automation system and method is described. The system and method include bays, with each bay having a group of tools. Temporary storage locations are provided. A transport system facilitates movement of materials from the tools. The system and method enable direct transfer of materials from a first tool to a second tool or transfer of materials from a first tool to a temporary storage location when a second tool is unavailable.

15 Claims, 8 Drawing Sheets

U.S. PATENT DOCUMENTS

2006/0190118 A1    8/2006   Teferra et al.
2007/0061034 A1*   3/2007   Puri et al. .................. 700/112
2007/0100486 A1    5/2007   Burda et al.
2007/0276532 A1*  11/2007   Teferra et al. .............. 700/112
2008/0275582 A1*  11/2008   Nettles et al. .............. 700/100

OTHER PUBLICATIONS

Uzma Syed et al.; "Anticipatory Real-Time Scheduling in Manufacturing Cell Design"; IEEE International Conference on Systems, Man and Cybernetics—Intelligent Systems for the 21st Century; Oct. 22-25, 1995; pp. 4131-4136; vol. 5; IEEE; New York, USA.

* cited by examiner

New FOUP reservation

AUTOMATED MANUFACTURING SYSTEMS AND METHODS

FIELD OF THE INVENTION

The present invention relates generally to manufacturing automation systems and methods.

BACKGROUND OF THE INVENTION

Manufacturing automation has become increasingly important as the need to remain high throughput increases. In manufacturing of a product, many processes may be needed. For example, semiconductor manufacturing may include over 400 processing steps involving more than 100 different tools. Furthermore, the process route can include a high level of reentrance in which the same tool or tool types are used. An important aspect in manufacturing automation is material handling. To facilitate material handling, automated transport systems are employed.

Conventional automated transport systems are used in, for example, a semiconductor manufacturing plant typically comprises a plurality of bays. Each bay includes a plurality of tools which are used to process wafers. Transport vehicles, such as overhead transport (OHT) are provided for automatic transfer of wafers contained in a carrier. A stocker which temporarily stores carriers is provided for each bay. A transport system controller controls the movement of carriers within a bay or between bays.

FIG. 1 shows the material flow of a conventional manufacturing facility having an automated transport system. At step 105, a manufacturing execution system (MES) polls the tools sequentially within a bay. The polling is achieved with a "watchdog". The MES can have multiple watchdogs, which each monitoring a respective group of tools. For example, each watchdog will monitor a certain number of tools, such as 10. The watchdog will go and check the status of the 10 tools to see whether a tool requires an OHT for carrier delivery or pickup. When a tool has a status which indicates that it requires the services of the automated transport system, it can be either to process another lot (A) or to pick up a processed lot (B). In the case where another lot is to be processed, the MES instructs the automated transport system to dispatch a vehicle to the stocker to retrieve a lot at step 115. The vehicle delivers the retrieved lot to the tool for processing at step 125. A situation may occur where the lot to be processed is located in a stocker of another bay. For such situation, the controller dispatches a vehicle in the main bay to retrieve the lot at step 155 and delivers it to the appropriate bay at step 165. Once the lot is in the appropriate bay, the process proceeds as in A. On the other hand, when a processed lot is to be picked up, the controller dispatches a vehicle to the tool. The vehicle retrieves the processed lot from the tool at step 135 and delivers it to the stocker at step 145. According to conventional automated transport systems, at least one stocker is necessary to serve as an intermediary.

The typical cycle time (e.g., time period from the process completion of a first lot to the arrival of a second lot for processing) of conventional automation system is greater than 11 minutes. It is desirable to increase manufacturing productivity of automation system by improving cycle time.

SUMMARY OF THE INVENTION

The present invention relates generally to manufacturing automation methods and systems. In one aspect of the invention, a method for manufacturing automation is disclosed. The method includes issuing a transfer request by a first tool to transfer a processing material of which the first tool has completed processing. A destination of the processing material is determined. The processing material is then transferred to a second tool for processing if the second tool is available. If the second tool is not available, the processing material is then transferred to a storage location.

In another aspect, the invention relates to a method for manufacturing automation. The method comprises issuing a transfer request by a first tool to transfer a processing material of which the first tool has completed processing. A destination of the processing material is determined by identifying available tool destinations and determining priority of the processing material for the available tool destinations. The processing material is then transferred to a second tool for processing by the second tool if the second tool is available. If the second tool is unavailable, the processing material is then transferred to a storage location.

A manufacturing automation system is provided in another aspect of the invention. The system comprises a plurality of bays having a plurality of tool group with temporary storage locations associated with the bays. A transport system for transferring processing material and an automation controller for controlling the transfer of the processing material. The processing material is transferred by the automation controller when requested by a first tool to a second tool if the second tool is available or to one of the temporary storage locations if the second tool is not available.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

Figure 1:
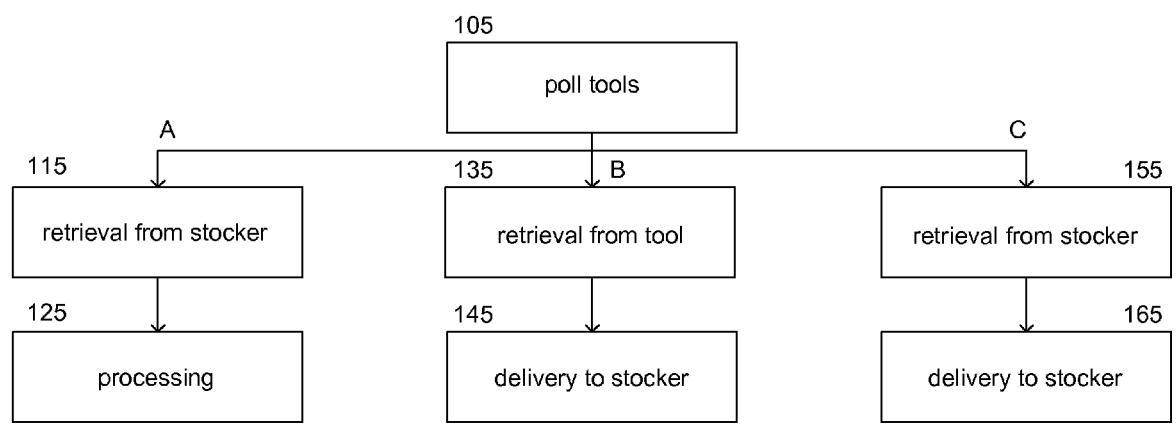
FIG. 1 shows the material flow of a conventional manufacturing facility with an automated transport system.
Figure 2:
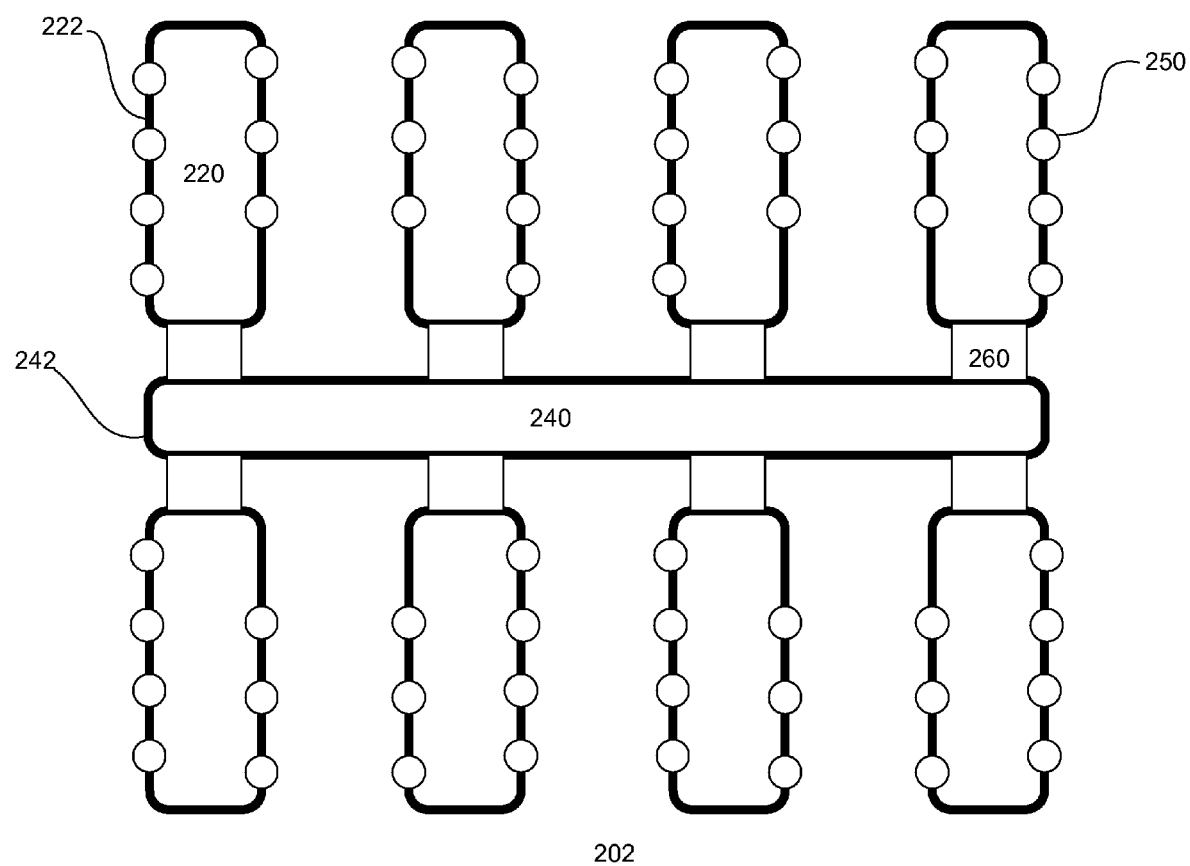
FIG. 2 shows a layout of an AMHS in accordance with one embodiment of the invention.

FIG. 2 shows a layout of an automated material handling system (AMHS) 202 in accordance with one embodiment of the invention. The AMHS is employed in, for example, a semiconductor manufacturing plant. The AMHS can also be used in the manufacturing of other products, for example, LCD panels. The factory layout may comprise a plurality of bays 220. The bays, in one embodiment, are located on opposite sides of a main bay or central isle 240. Tools 250 are arranged in a loop within a bay. A transport system, such as an AMHS is provided for the main bay and bays. The AMHS, in the embodiment, for example, comprises an overhead transport (OHT) system. The overhead transport system includes tracks 222 and 242 in which transport vehicles travel. Other types of transport systems are also useful. Typically, a loop contains multiple vehicles and travel in one direction. Other configurations, bi-directional travel within a loop, can also be useful. Transport vehicles in tracks 222 facilitate transfer of wafers contained in a carrier to tools within a bay (intra-bay) while transport vehicles in track 242 facilitate transfer of carriers between bays (inter-bay). Various types of carriers, such as front opening unified pods (FOUPs) can be used. Other types of carriers, including standard mechanical interface (SMIF) pods, are also useful. Generally, the wafers are grouped into lots. A carrier, for example, can contain 1 or more lots for processing. A stocker 260 for temporary storage of carriers is provided. In one embodiment, a stocker is associated with each bay. Alternatively, a stocker can be located between two adjacent bays for sharing therebetween. An AMHS controller is used for controlling the movements of the transports in the system.

Figure 3:
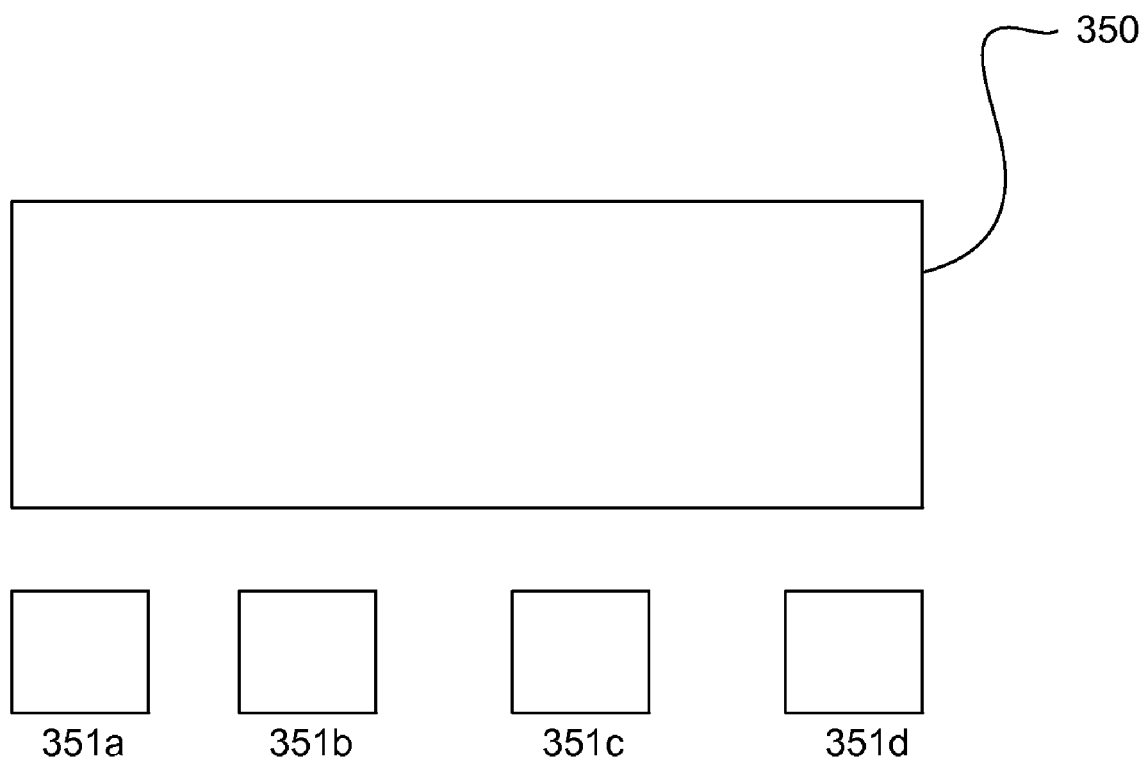
FIG. 3 shows an exemplary processing tool disposed in a bay.

FIG. 3 illustrates an exemplary tool 350 disposed in a bay. The tool can be any type of tool. The tool, for example, can be any type of tool used in semiconductor processing, such as a chemical vapor deposition (CVD) tool, an etcher, or an implanter. Other types of tools are also useful. The tool can include a plurality of load ports 351a-d. By providing multiple load ports, a tool can process multiple lots at the same time, thereby increasing throughput. Tools with other number of load ports (including 1) are also useful.

Figure 4:
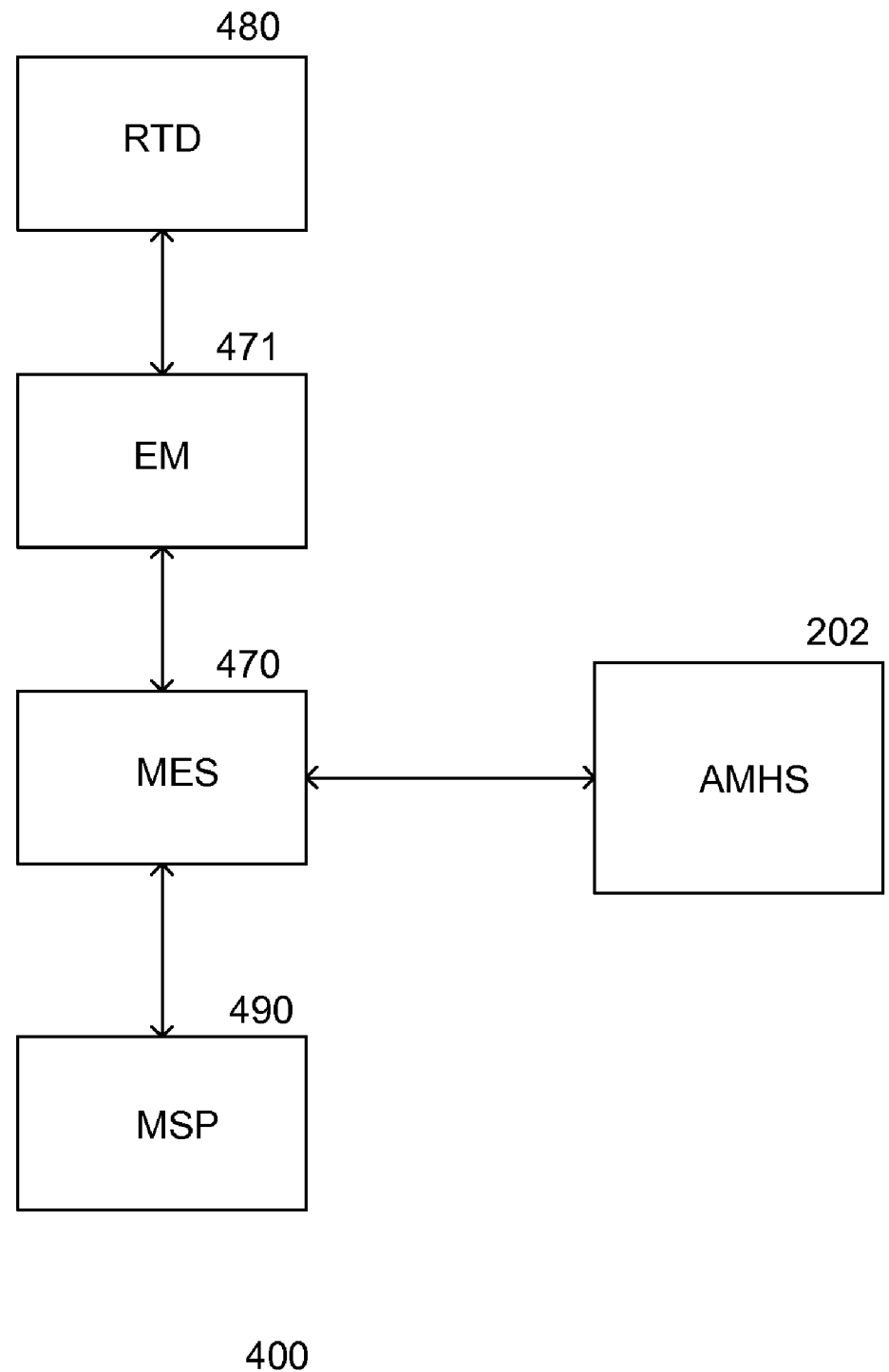
FIG. 4 shows an automation system for controlling the operation of a manufacturing plant in accordance with one embodiment of the invention.

FIG. 4 shows an automation system 400 for controlling the operation of a manufacturing plant in accordance with one embodiment of the invention. As shown in FIG. 4, the system comprises a manufacturing execution system (MES) 470. The MES monitors and tracks execution or operations in the manufacturing plant. For example, the MES tracks the location of carriers, status of tools, lot reservations and lot status. Other types of functions associated with the manufacturing plant can also be tracked by the MES. The MES interfaces with an event manager (EM) 471 and machine supervisory program (MSP) 490. The EM interfaces with a real time dispatcher (RTD) 480. The EM, in one embodiment, performs destination and priority analysis of materials which have been processed by a tool upon the event of the tool issuing an unload request. The RTD provides dispatching of carrier or lot sequences while the MSP provides communication with equipment and MES. The MES relays information to the AMHS for transporting carriers. In accordance with one embodiment of the invention, the AMHS comprises an event based AMHS. When a tool has finished processing a lot of wafers or a lot has been unloaded, the MSP informs the MES that the tool requires the services of the AMHS.

Figure 5A:
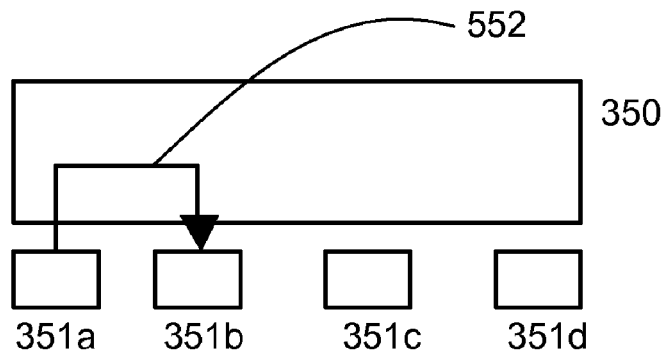
FIGS. 5a-c show various material flow options of an AMHS in accordance with one embodiment of the invention.
Figure 5B:
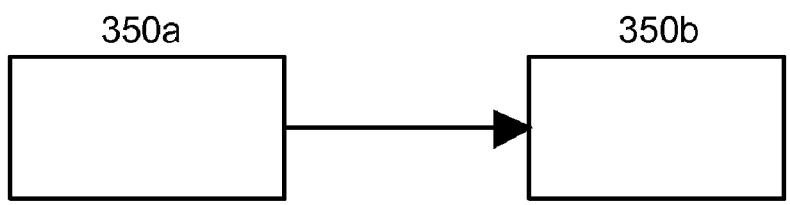
Figure 5C:
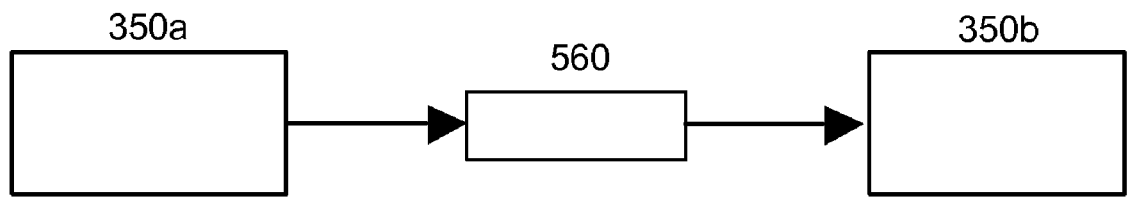

FIGS. 5a-c show various material flow options of an AMHS in accordance with one embodiment of the invention. Referring to FIG. 5a, a first material flow option is shown. As described in conjunction with FIG. 3, a tool 350 of the manufacturing plant can have a plurality of load ports 351a-d. In one embodiment, the AMHS enables, for example, a carrier containing a lot of wafers to be delivered directly from one or first port (e.g., 351a) to another or second port (e.g., 351b) as depicted by the arrow 552. A second option, as depicted by FIG. 5b, shows the AMHS transporting a carrier from a first tool 350a directly to a second tool 350b in the same bay. Direct transfer of a carrier to another port or to another tool avoids the need to use a stocker as an intermediary. Referring to FIG. 5c, a stocker 560 serves as an intermediary for transfer of a carrier from a first tool 350a to a second tool 350b. The stocker can also serve as an intermediary for transfer of a carrier from a first port to a second port of the tool when the second port is not available. Stockers are also used for inter-bay transfers. Alternatively, inter-bay transfers can be facilitated without the use of stockers. For example, the carrier can be transferred from one transport vehicle to another. By providing the option of direct transfer between tools, ports or bays, cycle time can be shortened.

Figure 6:
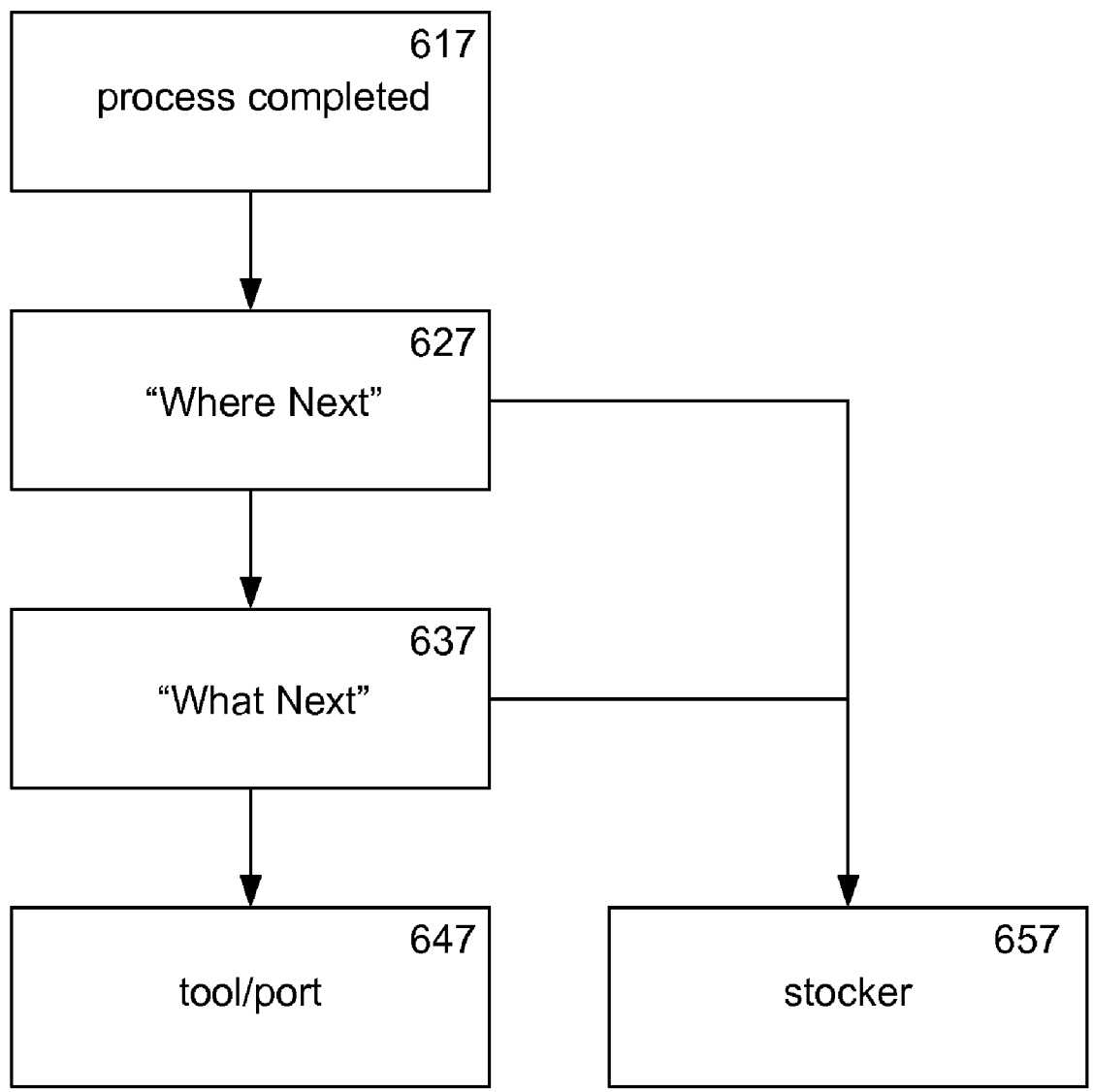
FIG. 6 shows a process flow of an automation system which determines the transfer options of an AMHS in accordance with one embodiment of the invention.

FIG. 6 shows a process in which the automation system determines the transfer options of the AMHS in accordance with one embodiment of the invention. At step 617, the MSP informs the MES that a tool has finished processing a lot. This event initiates the MES in conjunction with, for example, the EM to perform "Where Next" and "What Next" analysis at steps 627 and 637 respectively. In one embodiment, "Where Next" indicates the next destination of the processed lot from the tool. "What Next" indicates which lot is to be processed at the next destination. Once the next destination equipment is identified, the MES determines whether the equipment is available. If the equipment is not available, the MES instructs the AMHS to deliver the carrier to the stocker at step 657. On the other hand, if the equipment is available, the MES determines whether the lot has priority to be processed at the destination equipment. Priority rules can be designed in accordance with needs of a specific manufacturing facility. For example, priority can be determined based on lot type and/or schedule completion date (SCD). The AMHS delivers the carrier to the equipment at step 647 if it has priority, or else, to the stocker at step 657 if there is no priority.

Figure 7:
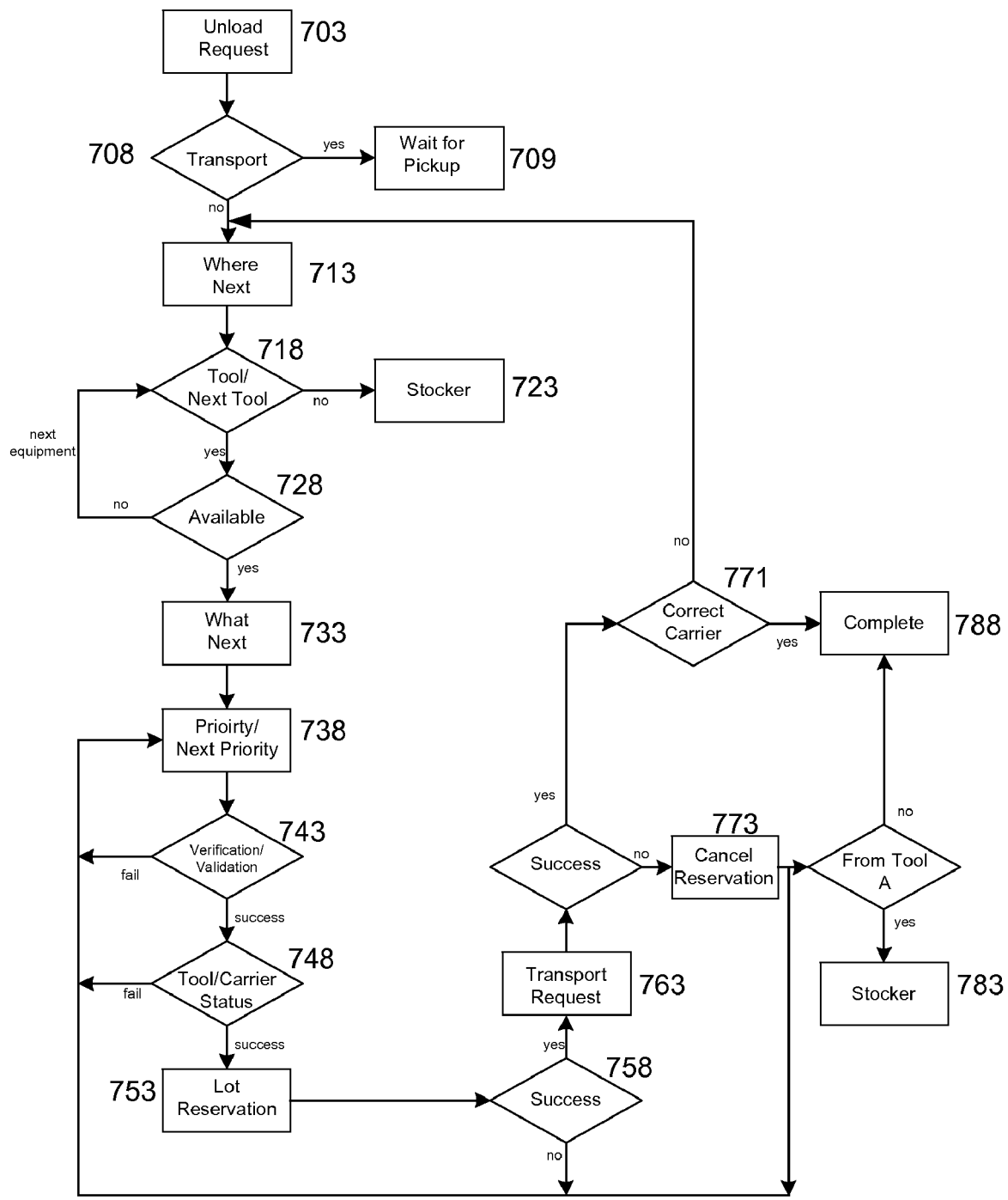
FIG. 7 shows a process flow of an automation system in accordance with one embodiment of the invention.

FIG. 7 shows a process flow 701 of the automation system in accordance with one embodiment of the invention. When a tool (e.g., Tool A) has finished processing a batch of material, it issues an unload request at step 703. For example, the unload request is issued when processing of a lot of wafers by the tool is finished. To transfer the wafers, they are loaded in a carrier such as a FOUP. Typically, a lot of wafers is assigned to a specific FOUP for the duration of the manufacturing process. The FOUP can contain more than one lot. Tracking of the FOUP can be achieved by, for example, bar codes or radio frequency tags. Other techniques for tracking FOUPs are also useful. The unload request can be issued by, for example the MSP of the tool.

Upon receiving the unload request, the MES checks to see if a transportation job has been assigned to the carrier associated with the lot available for transport at step 708. If a transportation job has been assigned, no action is required. The carrier waits for the AMHS to send an available vehicle to tool A to pick up the carrier at 709. On the other hand, if no transportation job has been requested, a "Where Next" analysis is performed at step 713. In one embodiment, the "Where Next" analysis is performed by the EM. In one embodiment, the EM requests a list of available destinations for the carrier. The available destination can be a stocker or a tool. In one embodiment, a tool destination takes priority over stocker destination. Factors used in determining available tool destinations include, for example, available tools for performing the next process on the material, status of the tools, as well as tool capabilities. Other factors, such as recipe availability or any tool dedication, can also be incorporated into the analysis. For example the tools can be filtered if the required recipe is not available. As an illustration, the next process for the lot of wafers in the carrier is an etch process. For the specified etch process, the facility has Tool B1, Tool B2, Tool B3, Tool B4 and Tool B5 which can be used. Out of these tools, Tool B1 is offline or unavailable, leaving Tools B2-B5 available. As a result, the list would indicate that Tools B2-B5 are available destinations.

At step 718, the EM determines from the list whether a stocker or a tool is the next destination. For the case where the next destination is a stocker, the EM at step 723, issues a transportation request to the AMHS for delivery to the stocker. In the case where the next destination is a tool (Tool B2), the EM determines if the tool is available. For example, the EM checks the status of the tool to ensure that it can accept the lot contained in the carrier for processing. If the tool is not available, the process returns to step 718 to determine availability of another tool on the list of available tool destinations (e.g., Tool B3). Steps 718 and 728 are repeated until a tool has been found available or all the tools in the list of available tool destinations have been queried. In the event that no tool on the list is available, the MES issues a transportation request to the AMHS for delivery to the stocker at step 723.

Once a tool from the list is determined to be available (e.g., Tool B4), the EM performs a "What Next" analysis at step 733. In one embodiment, the "What Next" analysis comprises obtaining a lot list from the RTD for Tool B4 (destination tool). The lot list contains a list of lots which Tool B4 can process in order of priority. As discussed, the lot list can depend on Rule settings, for example, lot type and completion date. The lot having the highest priority is selected at step 738. At step 743, the EM performs lot verification and validation process using, for example, MES. In one embodiment, the lot verification and validation process comprises matching the lot information from Tool A with lot information of the selected lot from the "What Next" analysis.

If the verification and validation process fails, the EM returns to step 738 to select the lot with the next highest priority for verification and validation at step 743. In the case where a carrier can contain multiple lots, it determines whether the MES can reserve multiple lots contained within the same carrier for processing. This, for example, occurs when the lots are running on the same recipe. Steps 738 and 743 are performed until a lot has passed the verification and validation. If all lots fail in the verification and validation process, the lots will be sent back to stocker.

Once the lot has been successfully verified and validated, the EM checks on the status of Tool B4 as well as the carrier at step 748. For example, the EM checks whether the load port or destination port of Tool B4 is ready. The EM also checks to see if the carrier is free (e.g., not reserved by another tool). In one embodiment, the EM at step 753 issues a lot reservation for Tool B4 when both the port and carrier are ready. On the other hand, if either the load port or carrier is not ready, the EM returns to step 738.

At step 758, the EM will submit the lot reservation to the MES, the MES determines whether the lot reservation was successful or not. If the lot reservation was unsuccessful, the MES will return an error message to the EM. When the EM receives this error message, it will return to step 738. A successful lot reservation causes the EM to issue a transportation request to the MES, causing it to request the AMHS to pick up the carrier from Tool A for delivery to Tool B4 at step 763. If the transportation job request was not formed successfully, the lot reservation is cancelled at step 773. If the transportation request was successfully formed, the MES at step 771 checks to see if the carrier reserved is the correct carrier associated with the lot of wafers to be unloaded at Tool A. In the event that the carrier is not the correct carrier, the MES returns to step 713. The lot reservation is completed at step 788 if the carrier is the correct carrier.

After the lot reservation has been cancelled at step 773, the EM returns to step 738 for the next lot for Tool B4. The EM at step 783 also checks whether the lot that has been cancelled at step 773 is the lot unloaded from Tool A. If the lot is from tool A, the EM issues a transportation job request to the AMHS to deliver the lot to the stocker at step 783. Otherwise, it proceeds to step 738.

Figure 8:
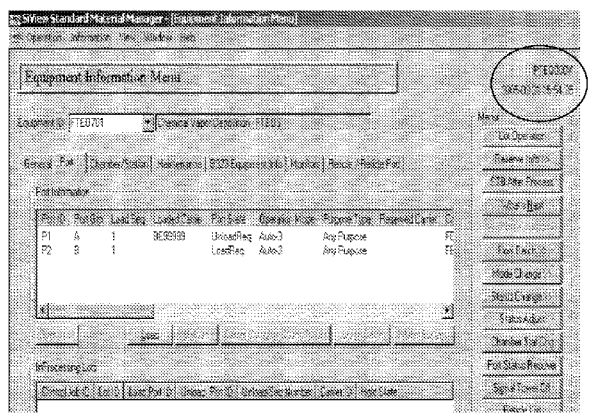
FIG. 8 shows an automation system in accordance with one embodiment of the invention.
Figure 8:
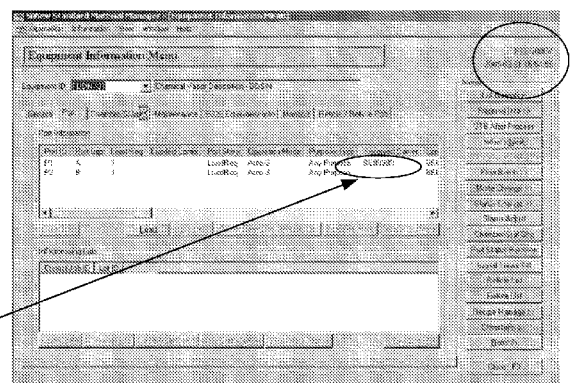

FIG. 8 shows an automation system in accordance with one embodiment of the invention. In one embodiment, the automation system comprises a MES. The MES is a SiView Standard Material Manager from IBM. Referring to FIG. 8, process cards 816 and 826 of the MES are shown. As indicated in card 816, FOUP BE99999 was unloaded from FTEO701 at 15:54:35. Card 826 shows that 20 seconds later, FOUP BE99999 was reserved by FDDN701. This indicates that the FOUP has not gone back to the stocker and was reserved by another tool. As evidenced by the cards, improvement in delivery time is achieved with the present invention. In one embodiment, it has been found that at least up to 60% in delivery time has been achieved.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for manufacturing automation comprising:
   issuing a transfer request by a first tool to transfer a processing material which the first tool has completed processing;
   determining a destination of the processing material comprising
      performing a next destination analysis which includes
         compiling a list of tools capable of processing the material in the next process step of the processing material,
         selecting an available tool from the list of tools as a next destination tool,
      performing a priority analysis of the processing material with respect to the selected tool to determine if the processing material has priority, and
      if the processing material has priority, the selected tool becomes the next destination tool, or
      if the processing material does not have priority, repeat the next destination analysis and priority analysis until a next destination tool is successfully selected or until the list of tools is exhausted; and
   transferring the processing material to a processing port of the successfully selected next tool destination or to a storage location if no next destination tool is successfully selected.

2. The method of claim 1 further comprises determining whether the transport request for transferring the processing material has already been assigned to the first tool after issuing the transfer request.

3. The method of claim 2 comprises:
   determining destination if no transport request has been assigned to the first tool after issuing the transfer request; or waiting for transport if the transport request has been assigned to the first tool.

4. The method of claim 1 wherein performing the priority analysis further comprises:
performing a processing material availability analysis to verify if processing material of higher priority is available to be processed on the selected tool, wherein
if there is no processing material of higher priority available to be processed on the selected tool, the processing material has priority, or
if there is processing material of higher priority available to be processed on the selected tool, the processing material does not have priority.

5. The method of claim 4 wherein processing material of higher priority is available to be processed on the selected tool if the processing material of higher priority is successfully reserved.

6. The method of claim 1 wherein the processing material comprises semiconductor wafers.

7. The method of claim 1 wherein the storage location comprises a stocker.

8. The method of claim 1 wherein the transfer request comprises an unload request by the first tool.

9. The method of claim 1 further comprising the step of determining whether a transportation job has been assigned after issuing the transfer request by the first tool.

10. The method of claim 1 comprising determining the destination of the processing material if no transportation job has been assigned after issuing the transfer request by the first tool.

11. A manufacturing automation system comprising:
a plurality of bays having a plurality of tool groups;
storage locations associated with the bays;
a transport system for transferring processing material; and
an automation controller for controlling the transfer of processing material, wherein the automation controller transfers the processing material when requested by a first tool to a second tool if the second tool is available to process the processing material based on a next destination and priority analyses or to a storage location, wherein next destination and priority analyses comprise
selecting an available tool from a list of tools capable of processing the material in the next process step of the processing material,
performing a priority analysis of the processing material with respect to the selected tool to determine if the processing material has priority, and
if the processing material has priority, the selected tool becomes the second tool, or
repeating selecting and performing the priority analysis until a second tool is selected or until the list of tools is exhausted.

12. The manufacturing automation system of claim 11 wherein tools of the tool groups comprise semiconductor manufacturing tools.

13. The manufacturing automation system of claim 11 wherein the priority analysis further comprises:
performing a processing material availability analysis to verify if processing material of higher priority is available to be processed on the selected tool, wherein
if there is no processing material of higher priority available to be processed on the selected tool, the processing material has priority, or
if there is processing material of higher priority available to be processed on the selected tool, the processing material does not have priority.

14. A program product for manufacturing automation stored on a computer readable medium, the computer readable medium comprising program code for performing the following steps:
issuing a transfer request by a first tool to transfer a processing material which the first tool has completed processing;
determining a destination of the processing material comprising
performing a next destination analysis which includes
compiling a list of tools capable of processing the material in the next process step of the processing material,
selecting an available tool from the list of tools as a next destination tool,
performing a priority analysis of the processing material with respect to the selected tool to determine if the processing material has priority, and
if the processing material has priority, the selected tool becomes the next destination tool, or
if the processing material does not have priority, repeat the next destination analysis and priority analysis until a next destination tool is successfully selected or until the list of tools is exhausted; and
transferring the processing material to a processing port of the successfully selected next tool destination or to a storage location if no next destination tool is successfully selected.

15. The program product of claim 9, wherein during the priority analysis the program code further performs the step of:
performing a processing material availability analysis to verify if processing material of higher priority is available to be processed on the selected tool, wherein
if there is no processing material of higher priority available to be processed on the selected tool, the processing material has priority, or
if there is processing material of higher priority available to be processed on the selected tool, the processing material does not have priority.

* * * * *